US009810736B2

(12) United States Patent
Cottrell et al.

(10) Patent No.: US 9,810,736 B2
(45) Date of Patent: Nov. 7, 2017

(54) SYSTEM AND APPARATUS FOR TRUSTED AND SECURE TEST PORTS OF INTEGRATED CIRCUIT DEVICES

(71) Applicant: Raytheon Company, Waltham, MA (US)

(72) Inventors: Rodrick Cottrell, Fort Wayne, IN (US); Dee C. Neuenschwander, Fort Wayne, IN (US)

(73) Assignee: Raytheon Company, Waltham, MA (US)

( * ) Notice: Subject to any disclaimer, the term of this patent is extended or adjusted under 35 U.S.C. 154(b) by 1 day.

(21) Appl. No.: 14/972,990

(22) Filed: Dec. 17, 2015

(65) Prior Publication Data

US 2017/0176530 A1    Jun. 22, 2017

(51) Int. Cl.
  *G01R 31/00*      (2006.01)
  *G01R 31/317*     (2006.01)
  *G01R 31/3177*    (2006.01)

(52) U.S. Cl.
  CPC ... *G01R 31/31719* (2013.01); *G01R 31/3177* (2013.01)

(58) Field of Classification Search
  None
  See application file for complete search history.

(56) References Cited

U.S. PATENT DOCUMENTS 7,600,166 B1 * 10/2009 Dunn ............... G01R 31/31719
                                                      714/726
9,165,143 B1 * 10/2015 Sanders ................ G06F 21/575
9,230,112 B1 * 1/2016 Peterson ............... G06F 21/575
2008/0282087 A1 * 11/2008 Stollon ............ G01R 31/31719
                                                      713/171
2010/0332783 A1 * 12/2010 Youm ..................... G06F 21/74
                                                      711/164

(Continued)

OTHER PUBLICATIONS

Clark et al. "Anti-tamper JTAG TAP design enables DRM to JTAG registers and P1687 on-chip instruments." 2010 IEEE International Symposium on Hardware-Oriented Security and Trust (HOST). (2010):19-24.

(Continued)

*Primary Examiner* — Daniel McMahon
(74) *Attorney, Agent, or Firm* — Burns & Levinson LLP; Joseph M. Maraia

(57) ABSTRACT

A trusted boot device secures JTAG scan chains of integrated circuit components on a circuit card assembly without necessarily modifying the integrated circuit components. Component JTAG port I/O scan chain signal pins are independently routed to FPGA fabric on the trusted boot device. The trusted boot device monitors the JTAG paths and triggers a security event if unauthorized activity is detected on a JTAG path. JTAG paths on the secure trusted boot device are latch disabled by default and upon detection of a security event. JTAG paths are only enabled for a predefined length of time. To prevent JTAG access when protected data is exposed, a watchdog timer latch disables the JTAG paths when the predefined time has expired and may trigger a security event if activity is detected after the time has expired. A power cycle is then used to re-enable authenticated JTAG enable requests.

19 Claims, 3 Drawing Sheets

(56) References Cited

U.S. PATENT DOCUMENTS

2013/0108063 A1* 5/2013 Verhoeve .......... G01R 31/3187
  381/58
2015/0242606 A1* 8/2015 Shin ................... G06F 21/31
  713/182

OTHER PUBLICATIONS

Clark. "Secure Hardware: What are the Big challenges?" (2009).
Kumar et al. "JTAG Architecture with Multi Level Security." IOSR J. Comp. Eng. 1.1(2012):54-59.
Peterson. "Developing Tamper Resistant Designs with Xilinx Virtex-6 and 7 Series FPGAs." Xilinx. (2013):1-20.
Pierce et al. "Enhanced Secure Architecture for Joint Action Test Group Systems." IEEE Transactions on Very Large Scale Integration (VLSI) Systems. 21.7(2013):1342-1345.
Pierce et al. "Multi-Level Secure JTAG Architecture." 2011 IEEE 17th International On-Line Testing Symposium. (2011):208-209.
Rosenfeld et al. "Attacks and Defenses for JTAG." IEEE Design & Test of Computers. (2010):1-13.
Tehranipoor. "JTAG Security and Trust." Powerpoint Presentation. (2012):1-20.
Tiwari. "A Novel Zero Overhead Obfuscation Technique for Securing FPGA Designs." IEEE International Conference on Advances in Computing, Communications and Informatics (ICACCI). (2013):554-558.

* cited by examiner

SYSTEM AND APPARATUS FOR TRUSTED AND SECURE TEST PORTS OF INTEGRATED CIRCUIT DEVICES

BACKGROUND

Integrated circuit architectures, configurations and methods have been standardized for in-circuit testing and debugging. Joint Test Access Group (JTAG) standards define standard testing and debugging architectures and methods that are widely used in the semiconductor chip industries. In-circuit test and debug architectures use the JTAG IEEE Std. 1149.1 (Standard Test Access Port and Boundary Scan Architecture) accessibility of on-chip embedded infrastructure for field initialization, debug, test, reconfiguration, monitoring, error management and repair. While JTAG capability is essential for development and maintenance of many semiconductor components and systems, it may conflict with requirements for security and safeguarding of protected data.

The JTAG security landscape involves numerous potential attackers, so securing JTAG compliant architectures has become increasingly problematic. For example, attackers may exploit the JTAG scan chain infrastructure to gain access to protected data, alter the system state to perform illegal operations, perform side-channel attacks, or enable unintended activation of the test or debug infrastructure. This may also lead to the violation of safety properties.

JTAG attackers may include manufactures of integrated circuit components and hostile end users or hackers. Attackers have exploited the JTAG-based capabilities on unprotected products by sniffing of the TDI (test data in)/TDO (test data out) bit streams, modifying the TDI/TDO bit streams, controlling the TMS (test mode select) and TCK (test clock) signals, and accessing protected data, for example. This could allow an attacker to collect protected data in transit, read-out protected data, obtain test vectors and responses, modify state of authentic part, and/or return false responses to a test.

As attackers who could potentially exploit JTAG enabled systems and components have become more of a risk, efforts to safeguard protected data, such as emerging anti-tamper requirements to protect military and consumer products, have increased.

Because JTAG is widely used and deeply engrained standard for in-circuit test, configuration, and debugging, which is embedded on most integrated circuit components, it would be impractical to simply exclude JTAG capabilities from trusted hardware. Thus, reliable techniques are needed to secure JTAG enabled systems and components against potential attackers.

Prior attempts to secure JTAG enabled systems and components have involved embedded die modifications to the JTAG enabled integrated circuit components. Examples of such die modifications include adding TAP (test access port) lock and adding key registers, and adding circuitry for authentication, encryption and decryption of the TDI/TDO bit streams. Different approaches in this area have included challenge/response techniques, public/private key authentication techniques, and authorized permission techniques, for example.

An alternative approach to securing JTAG enabled systems and components has been to remove access to the JTAG circuitry by open-circuiting security fuses built into the integrated circuit components before the hardware leaves the factory. Other proposed security techniques involve disabling buffers in JTAG scan chains or configuring JTAG systems (TMS and TCK connections) in a star pattern instead of a daisy chain configuration, for example.

Although these techniques may provide some better protection against potential JTAG attackers, they have only been implemented in a few components because they increase the cost of the integrated circuit components and consume substantial die space for each component.

Emerging approaches to securing JTAG scan chains based on embedded IC component encryption, authentication and authorization provide protected bit stream encryption at the integrated circuit component, but cannot prohibit or detect attacker physical access to the JTAG scan chain infrastructure.

SUMMARY

According to aspects of the present disclosure, a trusted boot component is used to provide authorized JTAG testing, guarded by a watchdog period while in an initial unsecure state. In the initial unsecure state all protected data (Secret key or IP) is encrypted at rest and is unavailable or not accessible. When JTAG is not authorized, the trusted boot component internal FPGA default disables all JTAG I/O GPIO pins and monitors each pin for a security event of unauthorized activity on the JTAG scan chain infrastructure signals. When authorized using the authentication features of the trusted boot components, the trusted boot component will transition to the secure state, where protected data (Secret key or IP) will be available for access. Transition to the secure state will be allowed only after the trusted boot component has latched disabled of all JTAG I/O GPIO pins and started monitoring each JTAG I/O GPIO pins for a security event of unauthorized activity of JTAG scan chain infrastructure signals.

An aspect of the present disclosure includes an integrated circuit architecture for securely controlling JTAG paths to a plurality of JTAG enabled integrated circuit components of an apparatus. The integrated circuit architecture includes trusted boot circuitry on the apparatus coupled to each of the plurality of JTAG enabled devices. The trusted boot circuitry includes configurable multiplexor circuitry, a first set of input/output ports coupled to the configurable multiplexor circuitry via a plurality of separate secure JTAG paths, and JTAG control circuitry coupled to the configurable multiplexor circuitry, the JTAG control circuitry configured to constantly monitor the secure JTAG paths via the configurable multiplexor circuitry. The first set of input/output ports are configured for separately coupling to respective JTAG ports of the plurality of JTAG enabled integrated circuit components.

According to another aspect of the present disclosure, the integrated circuit architecture includes a second set of input/output ports coupled to the configurable multiplexor circuitry, and one or more headers coupled to the second set of input/output ports. The second set of input/output ports can be configured as securable JTAG ports of integrated circuit architecture to enable JTAG functionality of the integrated circuit architecture, for example. The integrated circuit architecture includes watchdog timer circuitry coupled to the configurable multiplexor circuitry. In an illustrative embodiment, the watchdog timer circuitry is configured to limit an amount of time that one or more of the separate secure JTAG paths may be configured in an initial unsecure state. The integrated circuit architecture the JTAG control circuitry is configured to encrypt signaling on one or more of the separate secure JTAG paths while the corresponding separate secure JTAG paths are configured in an initial unsecure state.

According to another aspect of the present disclosure, the integrated circuit architecture the JTAG control circuitry is configured to decouple one or more of the separate secure JTAG paths from all external circuit paths while the corresponding separate secure JTAG paths are configured in an initial unsecure state.

Another aspect of the present disclosure includes apparatus having a number of JTAG signal ports, in which each of the JTAG signal ports is coupled to an isolated external JTAG signal port of one of a number of external JTAG enabled devices. The JTAG signal ports include a respective JTAG signal port for each external JTAG signal port of each of the external JTAG enabled devices. The apparatus also includes configurable field programmable gate array (FPGA) circuitry coupled to the plurality of JTAG signal ports via isolated securely routed internal JTAG paths.

According to this aspect of the disclosure, the apparatus also includes processor circuitry coupled to the FPGA circuitry and a number of input/output ports coupled to the processor circuitry. The processor circuitry is configured to monitor signals on the plurality of isolated securely routed internal JTAG paths.

In an illustrative embodiment, the FPGA circuitry is configured to form a JTAG scan chain of the plurality of external JTAG enabled devices. In this embodiment, the processor circuitry comprises a JTAG boundary scan engine configured for performing boundary scan of the JTAG scan chain.

According to another aspect of the present disclosure, the apparatus includes a structural shield covering and configured to prevent access to the JTAG signal ports, the field programmable gate array (FPGA) circuitry, the isolated securely routed internal JTAG paths, the processor circuitry coupled to the FPGA circuitry, and the input/output ports.

BRIEF DESCRIPTION OF THE DRAWINGS

The foregoing will be apparent from the following more particular description of example embodiments of the present disclosure, as illustrated in the accompanying drawings in which like reference characters refer to the same parts throughout the different views. The drawings are not necessarily to scale, emphasis instead being placed upon illustrating embodiments of the present disclosure.

DETAILED DESCRIPTION

Aspects of the present disclosure include a physically reconfigurable JTAG scan chain infrastructure connection and monitoring system embedded within trusted field programmable gate array (FPGA) fabric. The disclosed system and method for securing a JTAG scan chain infrastructure prevents unauthorized access to on-chip protected data such as secret key or IP protected data and is compatible with the IEEE Std. 1149.1 and DFT (Design for Testability) standards.

Embodiments of the disclosed trusted boot component are configured to detect JTAG attacks on a scan chain infrastructure. Such attacks may include attacks modifying JTAG TDI (test data input) and/or TDO (test data output) bit streams; attacks controlling the TMS (test mode select) and/or TCK (test clock) signals; attacks to gain access to protected data, such as keys and IP; and/or JTAG side channel attacks. The trusted boot component may also be configured to detect unauthorized activations of test and/or debug infrastructure, which may lead to violation of safety properties, for example. A trusted response or penalty may be automatically triggered by the trusted boot component when any JTAG attack is detected.

The disclosed system and method provides a systematic approach to securing and monitoring of all scan chain interconnections of a module such as a circuit card assembly. The scan chain interconnections are verified upon power-on of the module. The trusted boot component provides constant and secure monitoring of all integrated circuit components that have JTAG ports in the module.

According to an aspect of the present disclosure, JTAG security event detection and penalties are contained within the trusted boot component. An embedded JTAG latch disable, is configured in a disable state by default. Once the JTAG latch disable is set, a power-cycle is required to re-enable the JTAG ports. This prevents JTAG access when protected data such as keys or IP are exposed. Reset control for integrated circuits that have JTAG ports securely and independently coupled to the trusted boot component is provided within the trusted boot component. According to another aspect of the present disclosure, securable development debug ports are supported in the same circuit card assembly design. This permits necessary JTAG functionality for development and maintenance.

Figure 1:
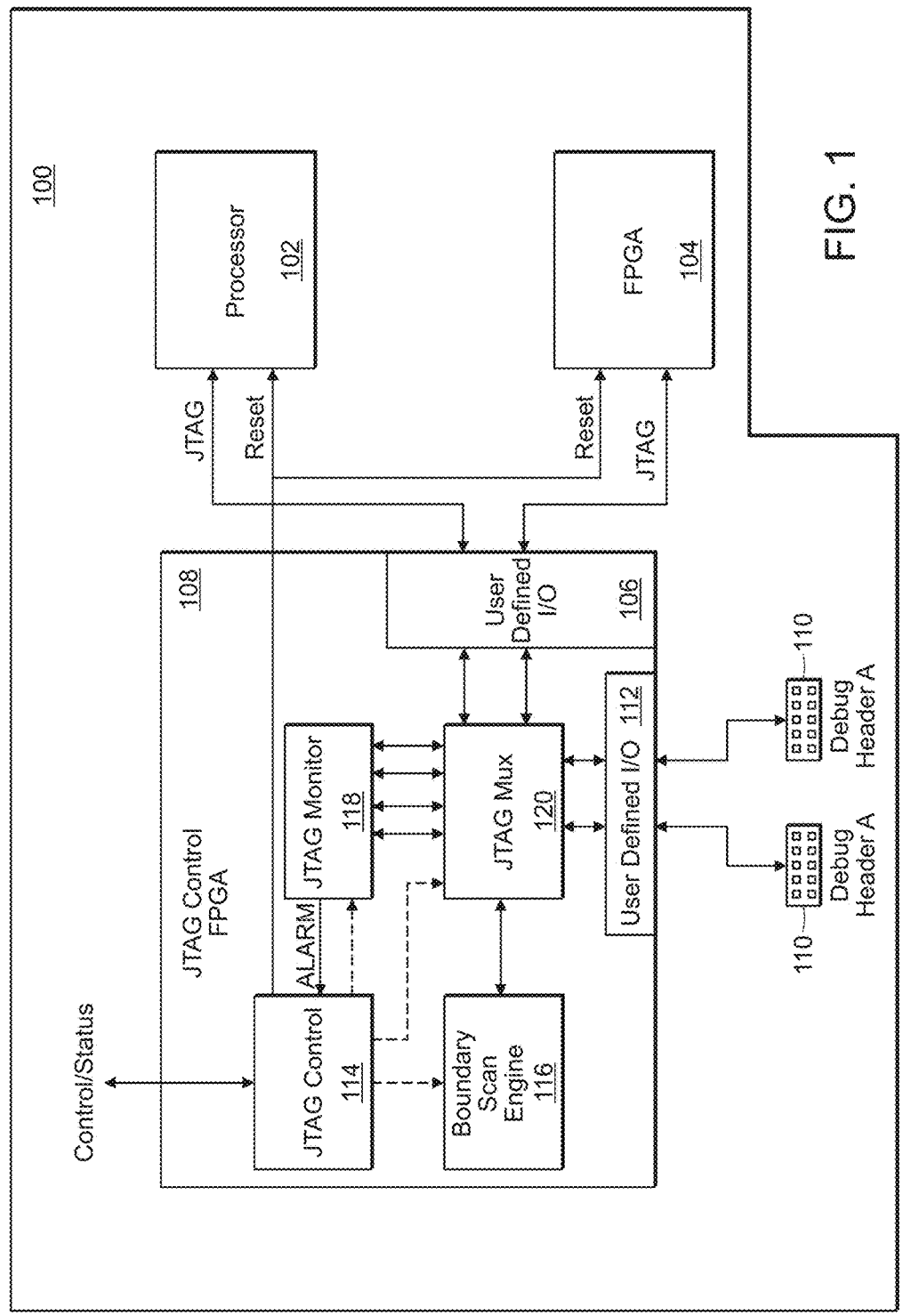
FIG. 1 is a system block diagram illustrating a module including a number of JTAG enabled devices according to an aspect of the present disclosure.

FIG. 1 is a system block diagram illustrating a module 100 such as a circuit card assembly including a number of JTAG enabled devices according to an aspect of the present disclosure. In this illustrative embodiment, one of the JTAG enabled devices is processor 102 and another JTAG enabled device is a field programmable gate array (FPGA) 104. All JTAG enabled devices 102, 104 of the module 100 are connected to a first set of user-defined I/O (input/output) pins 106 of a trusted boot component 108. In the illustrative embodiment the trusted boot component 108 is an FPGA. JTAG control software and/or firmware is implemented in the trusted boot component 108.

JTAG Debug/Programming headers 110 are connected to a second set of user-defined I/O pins 112 of the trusted boot component 108. The first set of user-defined I/O pins 106 and the second set of user-defined I/O pins 112 of the trusted boot component 108 are coupled directly and securely to multiplexing circuitry 120 in within the trusted boot component 108. The multiplexing circuitry 120 may be implemented in field programmable gate array (FPGA) circuitry, for example.

According to aspects of the present disclosure, JTAG control circuitry 114 in the trusted boot component 108 can be controlled by the software or firmware to configure the trusted boot component 108 for one or more secure JTAG functions. For example, the JTAG control circuitry 114 can configure the trusted boot component 108 to provide emulator or programmer connections to the individual JTAG enabled devices 102, 104 via the multiplexor circuitry 120.

The JTAG control circuitry 114 can also configure the trusted boot component 108 to allow JTAG boundary scanning of the JTAG enabled devices 102, 104 using commercial test equipment. The commercial test equipment may be connected to the debug header 110, for example. The JTAG control circuitry 114 can also configure the trusted boot component 108 to support built-in-testing by embedded boundary scan circuitry 116 in the trusted boot component 108. The boundary scan circuitry 116 may be coupled to the JTAG enabled devices 102, 104 via the multiplexor circuitry 120.

According to another aspect of the present disclosure, the trusted boot component includes JTAG monitor circuitry 118 coupled to the multiplexor circuitry 120 and to the JTAG control circuitry 114. The JTAG control circuitry 114 is configured to communicate with JTAG monitor circuitry 118 of the trusted boot component 108 and to configure the JTAG monitor circuitry 118 to secure and monitor JTAG connections to each of the JTAG enabled devices 102 104 of the module 100 via the multiplexor circuitry for detection of malicious activity.

When the module 100 has been placed in secure state, the first set of user-defined I/O pins 106, which are connected to JTAG ports of the JTAG enabled devices 102, 104, and the second set of user-defined I/O pins 112, which are connected to the debug headers 110, are configured as inputs. All of these signal paths are continuously monitored for activity. Activity on any of these signal paths, while the module 100 is in the secure state, triggers an alarm to a controlling entity.

Embodiments of the disclosed system and method implement a secure trusted boot system on a chip (SoC) device to secure JTAG scan chains. Examples of a suitable SoC device for implementation according to aspects of the present disclosure include The SMartFusion2 SoC by Microsemi Corporation of Aliso Viejo, Calif., USA and the Zynq-7000 SoC by Xilinx Inc. of San Jose, Calif., USA.

Figure 2:
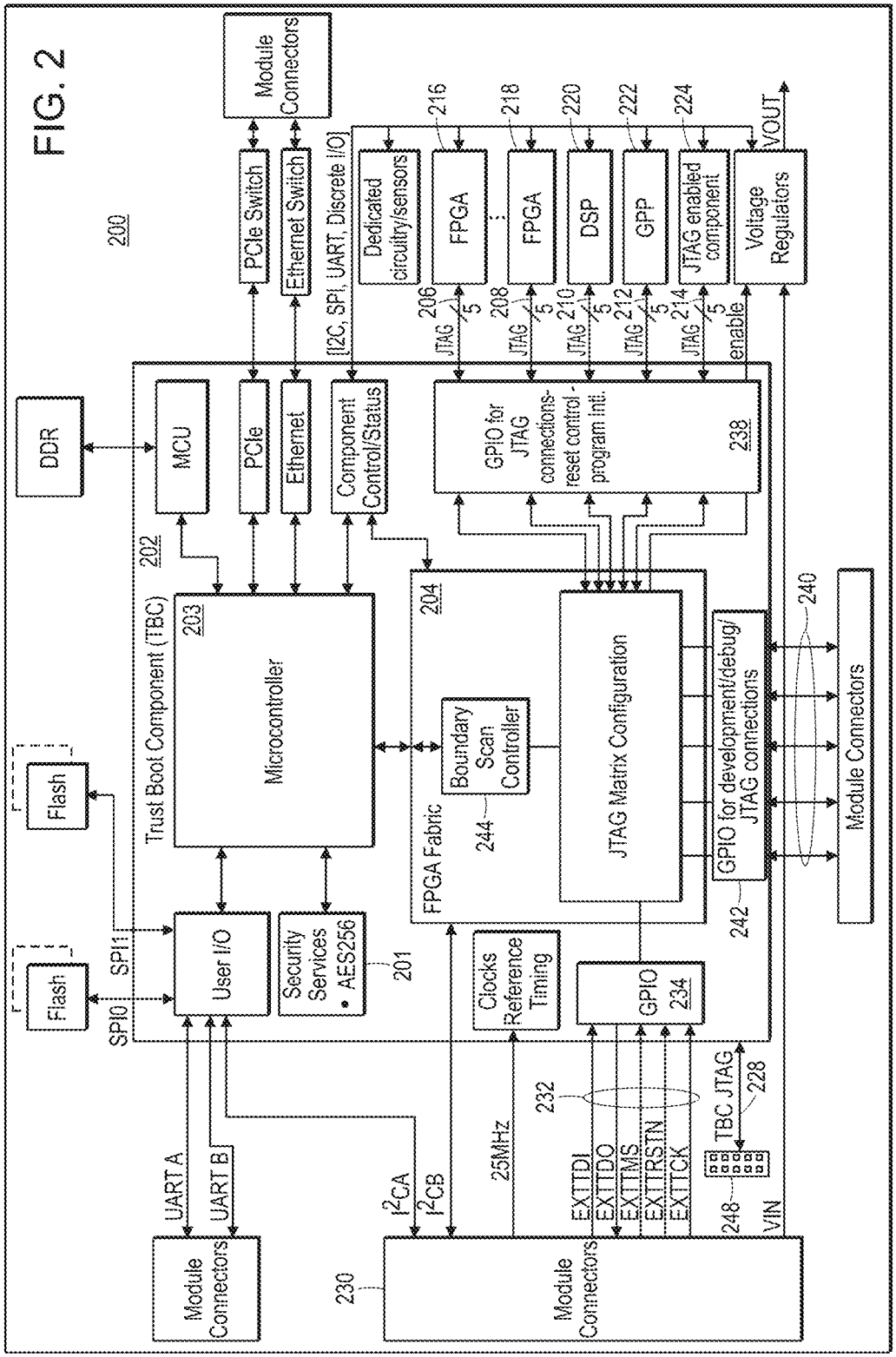
FIG. 2 is a system block diagram of a secure JTAG embedment of a circuit card assembly trusted boot component according to an aspect of the present disclosure.

An example secure JTAG embedment of a CCA trusted boot component according to an aspect of the present disclosure is described with reference to FIG. 2. The disclosed embedded system includes a trusted boot component 202 configured to implement a secure module JTAG scan chain infrastructure. In this example, the trusted boot component 202 comprises a SmartFusion2 SoC by Microsemi Corporation of Aliso Viejo, Calif., USA. The SmartFusion2 SoC includes embedded AES256 (advanced encryption standard 256) encryption circuitry 201, processor circuitry 203 including an ARM (advanced reduced instruction set computer machine) processor element, and FPGA fabric 204. According to aspects of the present disclosure, the trusted boot component 202, is configured to provide physical separation of component JTAG ports 206, 208, 210, 212, 214 and a dynamic configurable JTAG scan chain infrastructure within a secure boot environment.

According to aspects of the present disclosure, for each component 216, 218, 220, 222, 224 on a circuit card assembly (CCA) 200 that has a JTAG port, the component's JTAG port 206, 208, 210, 212, 214 includes a five conductor interface. The individual conductors of the five conductor interface are TDI (test data in), TDO (test data out), TMS (test mode select), TCK (test clock), and TRST (trust).

According to aspects of the present disclosure, each conductor in each of the five conductor interfaces are connected to separate GPIO (general purpose input/output) pins 238 of the FPGA fabric 204. Therefore, according to aspects of the present disclosure, no physical JTAG chain connection is external to the FGPA fabric 204 of the trusted boot component 202.

The trusted boot component 202 includes its own JTAG port 228, which is only used for the initial production load of the trusted boot component image. According to an aspect of the present disclosure, the JTAG port 228 of the trusted boot component 202 is not tied or physically connected in a JTAG scan chain infrastructure or to other module components with JTAG ports. In addition, the trusted boot component (TBC) JTAG port 228 is never physically connected to a module external connector 230. The disclosed configuration of a trusted boot component 202 provides built in monitoring and protection for the TBC JTAG port 228. The built in monitoring and protection of the TBC JTAG port 228 provides a safeguard to protected data within.

According to an aspect of the present disclosure, the CCA 210 may be installed in a module along with covers installed over the CCA 200 to conceal and prevent access to the JTAG port 228 of the trusted boot component 202 when fielded. The covers may comprise metal clam shell type covers attached to the front and back of the CCA 210, for example.

According to another aspect of the present disclosure, the CCA 200 includes a backplane connector comprising five JTAG signal paths 232. The five JTAG signal paths 232 are routed securely via buried traces to GPIO 234 pins of the FPGA fabric 204. Each of the five JTAG port signals of each of the other components 216, 218, 220, 222, 224 with a JTAG port on the CCA 200 are independently securely routed via buried traces to different GPIO pins 238 of the FPGA fabric 204. For example, coupling six components with five conductor JTAG ports to GPIO pins 238 and coupling the five JTAG signal paths 232 of a backplane connector to GPIO pins 234 results in using $(6+1)_{port} * 5_{wire} = 35$ GPIO pins of the FPGA fabric 204.

According to another aspect of the present disclosure, each of the GPIO pins 234, 238, 242 of the trusted boot component 202 that are attached to JTAG port signals are default disabled at power on to prohibit attack on the JTAG port and are not physically interconnected within the FPGA fabric 204 to any other JTAG GPIO pins. In addition, according to another aspect of the present disclosure, each of GPIO pins 234, 238, 242 of the trusted boot component 202 that are interfaced to integrated circuit component JTAG signals are monitored when disabled to detect attack or to determine if unauthorized activity is present on the JTAG ports, which would result in a security event detected.

Upon detection of a security event, the trusted boot component 202 may be configured to respond by performing appropriate steps based on the event to prevent activities that may lead to the violation of safety properties. For example, the trusted boot component may be configured to protect data by deleting security keys or to prevent altering of the system state to perform illegal operations. The trusted boot component may also be configured to prevent side-channel attacks and unintended activation of the test or debug infrastructure, in response to a detected security event, for example.

According to aspects of the present disclosure, the trusted boot component 202 may allow internal connections of JTAG scan chains within the FPGA fabric 204 prior to entering a secure state. The internal JTAG connections are based upon separate authenticated control interface messages to the processor circuitry 203 of the trusted boot component 202. The authenticated message(s) received by the processor circuitry 203 may provide authorization for a JTAG scan chain to be enabled and established for an authorized period of time for fabric JTAG interconnections to be enabled. In the event that a JTAG scan chain test fails to complete within an allocated time, the JTAG interconnection in the FPGA fabric 204 are disabled.

The FPGA fabric 204 may be configured to include internal scan chains in many different configurations without affecting the layout of the securely routed (i.e. buried) traces from the GPIO pins 234, 238 of the FPGA fabric 204.

Because the JTAG paths are independent, multiple simultaneous emulator connections to processing or control elements on the CCA 200 may be configured for development and integration efforts.

Debug configurations may be performed using different trusted boot component 202 build images or may be authorized via appropriate authenticated control messaged to the processing circuitry 203 of the trusted boot component 202.

According to another aspect of the present disclosure, additional GPIO pins 240 of the trusted boot component 202 are coupled to a debug connector interface 242 on the CCA 200. JTAG signals of the processing circuitry 203 may be routed to the debug connector interface 242. The debug connector interface 242 allows the connection of external equipment such as in-circuit emulators to the trusted boot component 202, for example.

According to an aspect of the present disclosure CCA JTAG boundary scan testing can be performed by using an embedded JTAG bit sequencer 244 built into the FPGA fabric 204 to generate a test vector and to evaluate the received bit stream. When the trusted boot component 202 performs a JTAG boundary scan via the embedded bit sequencer 244, a test vector is output on the TDO signal path. Verification is performed on the bit stream that is received on the TDI signal path. Verification may include a file compare and/or a cyclic redundancy check of the bit stream, which generates a pass or fail result.

In another example, JTAG boundary scan testing on the CCA 200 is performed by including the external backplane JTAG signals in the scan chain configuration to be tested via an external boundary scan test controller. The scan chain is configured by the trusted boot component 202 FPGA when appropriate authentication and authorization is received.

According to an aspect of the present disclosure, multiple JTAG interconnections may be configured within the FPGA fabric under predetermined appropriate conditions and/or when appropriately authorized. The different configurations may include single component scan chains for faster bit stream test execution, for example. Configuration of JTAG interconnection within the FPGA fabric may also allow for external connection of JTAG scan chains when protected data are secured or not installed on the CCA, for example.

According to another aspect of the present disclosure the JTAG GPIO pins 234, 238, 242 are internally disabled in response to a control interface message that includes an authentication and authorization to transition to secure state. The secure state may be desired to access or load protected data, for example. The internal disabling of the JTAG GPIO pins 234, 238, 242 disconnects the fabric interconnections within the FPGA until a power cycle of the CCA 200 is performed. The power cycle of the CCA 200 then removes the JTAG disable latch and any resident unprotected data.

In an illustrative embodiment, the only way to clear the internal JTAG disable latch is to power cycle the CCA 200. This prevents unintended connections between the JTAG GPIO pins 234, 238, 242 internal to the FPGA fabric 204. Such unintended connections could be connections made via a control interface message attempting to enable the JTAG ports when in a secure state, for example.

When they are disabled, each user defined JTAG GPIO pin 234, 238, 242 of the trusted boot component 202 is constantly monitored for I/O level transitions or unauthorized activity on the TDI, TDO, TMS, TCK, and TRST signal paths. In the event that I/O level transitions or activity is detected on any monitored external signal on the GPIO pins 234, 238, 242, the trusted boot component 202, responds to the security event by performing predefined operations to safeguard the protected data.

In the illustrated embodiment, the trusted boot component's own JTAG port 228 is isolated and only connected to a header 248 on the CCA 200. The header 248 permits initial secure production programming of the trusted boot component 202.

According to an aspect of the present disclosure, all of the FPGA fabric 204 defined GPIO JTAG ports 234, 238, 242 are disabled by default. When they are disabled, FPGA fabric 204 monitors each JTAG signal I/O level for unauthorized activity. When unauthorized activity is detected, the FPGA fabric 204 internally disables all of JTAG ports 234, 238, 242 and triggers a security event within the trusted boot component 202.

The FPGA fabric 204 defined GPIO JTAG ports 234, 238, 242 are only enabled via authenticated message(s) to allow authorization for a JTAG scan chain to be established for an authorized period of time. The JTAG interconnections are latch disabled upon a watchdog timer timeout of the authorized period of time in the event that a JTAG scan chain test fails to complete within allocated time. This triggers a security event within the trusted boot component 202. The JTAG ports remain latch disabled until a power cycle of the CCA, which removes any resident unprotected data.

According to aspects of the present disclosure, multiple securable development debug ports in same circuit card assembly design may be coupled to the trusted boot component. The disclosed trusted boot component architecture is compatible with other secure JTAG approaches (e.g. Bit stream encryption components, etc . . . ) and supports JTAG IEEE Std. 1149.1 and DFT (Design for Testability) standards.

Figure 3:
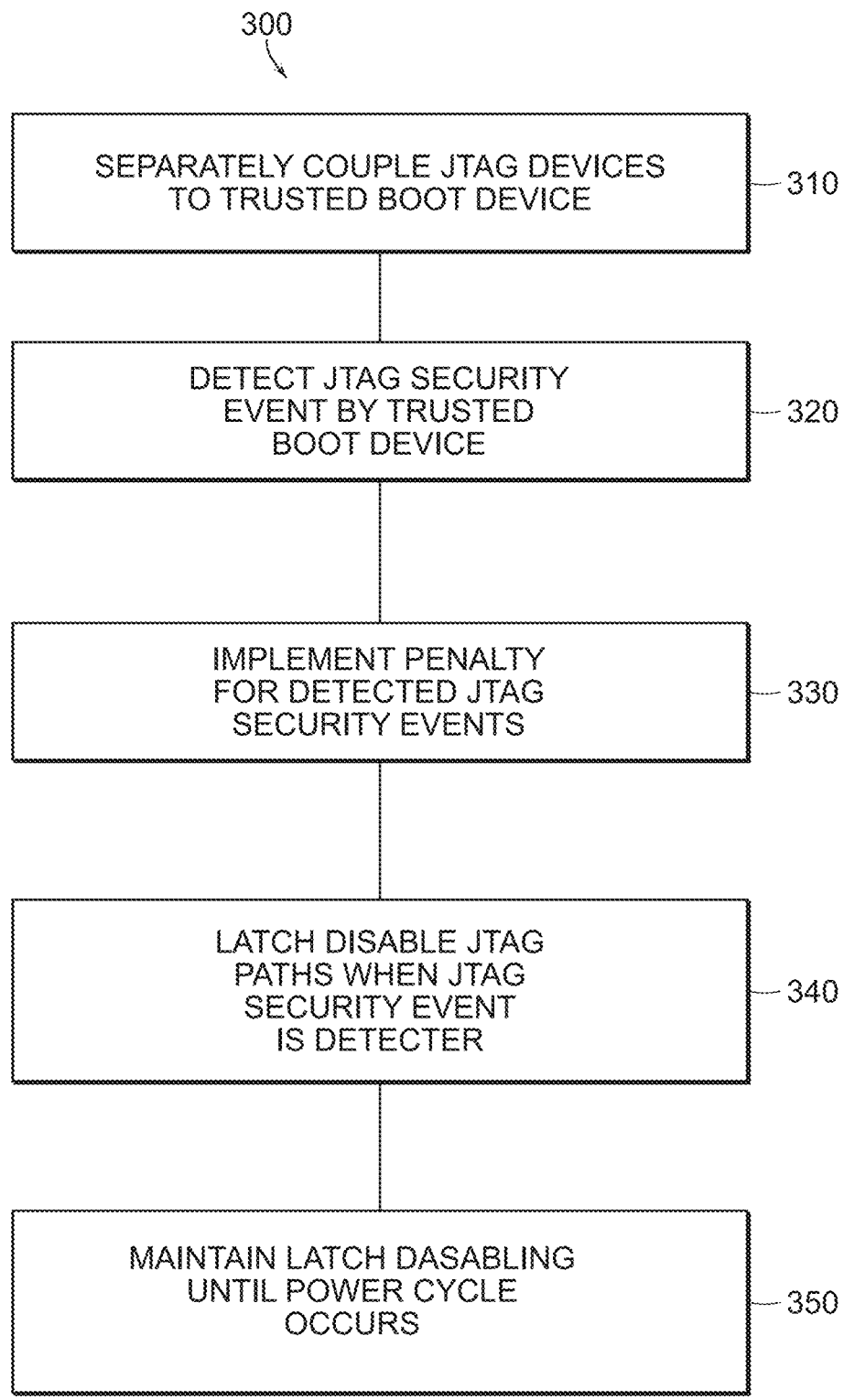
FIG. 3 is a process flow diagram illustrating a method for securing JTAG scan chains according to an aspect of the present disclosure.

A method for securing JTAG scan chains according to an aspect of the present disclosure is described with reference to FIG. 3. The method 300 includes separately coupling a plurality of JTAG enabled devices in the JTAG scan chains to a secure trusted boot device in block 310 and detecting JTAG security events by the trusted boot device in block 320. Separately coupling the plurality of JTAG enabled devices to the secure trusted boot device involves independently routing respective JTAG port I/O scan chain infrastructure signal pins of the JTAG enabled devices to the secure boot device. According to an aspect of the present disclosure, in block 330 the method also includes implementing a penalty for a JTAG security event detected by the trusted boot device. In block 340, the method includes latch disabling JTAG paths between the JTAG enabled devices and the trusted boot device when the JTAG security event is detected. In block 350, the method includes maintain the latch disabling until a power cycle of the trusted device occurs.

The above-described systems and methods can be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by an apparatus and can be implemented as special purpose logic circuitry. The circuitry can, for example, be implemented in a SoC (system on chip), an FPGA (field programmable gate array) and/or an ASIC (application-specific integrated circuit). Modules, subroutines, and software agents can refer to portions of the computer program, the processor, the special circuitry, software, and/or hardware that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include (and can be operatively coupled to receive data from and/or transfer data to) one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computer having a display device. The display device can, for example, be a cathode ray tube (CRT) and/or a liquid crystal display (LCD) monitor. The interaction with a user can, for example, be a display of information to the user and a keyboard and a pointing device (e.g., a mouse or a trackball) by which the user can provide input to the computer (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computers and having a client-server relationship to each other.

Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, Bluetooth, code-division multiple access (CDMA) network, time division multiple access (TDMA) network, global system for mobile communications (GSM) network), and/or other circuit-based networks.

The computing device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a Blackberry® device or Apple® iPad device.

The terms 'comprise', 'include', and/or plural forms of each as used herein are open ended and include the listed parts and can include additional parts that are not listed. The term 'and/or' as used herein is open ended and includes one or more of the listed parts and combinations of the listed parts.

One skilled in the art will realize the aspects disclosed herein may be embodied in other specific forms without departing from the spirit or essential characteristics thereof. The foregoing embodiments are therefore to be considered in all respects illustrative rather than limiting of the aspects described herein. The teachings of all patents, published applications and references cited herein are incorporated by reference in their entirety.

While the present disclosure has been particularly shown and described with references to example embodiments thereof, it will be understood by those skilled in the art that various changes in form and details may be made therein without departing from the scope of the present disclosure encompassed by the appended claims.

What is claimed is:

1. An integrated circuit architecture for securely controlling JTAG paths to a plurality of JTAG enabled integrated circuit components of an apparatus, the integrated circuit architecture comprising:

trusted boot circuitry on the apparatus coupled to each of the plurality of JTAG enabled integrated circuit components, wherein the trusted boot circuitry comprises:
configurable multiplexor circuitry;
a first set of input/output ports coupled to the configurable multiplexor circuitry via a plurality of separate secure JTAG paths, the first set of input/output ports configured for separately coupling to each of the plurality of JTAG enabled integrated circuit components; and
JTAG control circuitry coupled to the configurable multiplexor circuitry, the JTAG control circuitry configured to constantly monitor the plurality of separate secure JTAG paths via the configurable multiplexor circuitry;
wherein the JTAG control circuitry is configured to decouple one or more of the separate secure JTAG paths from all external circuit paths while the separate secure JTAG paths are configured in an initial unsecure state.

2. The integrated circuit architecture of claim 1, comprising:
a second set of input/output ports coupled to the configurable multiplexor circuitry; and
one or more headers coupled to the second set of input/output ports.

3. The integrated circuit architecture of claim 2, wherein the second set of input/output ports are configured as securable JTAG ports of integrated circuit architecture to enable JTAG functionality of the integrated circuit architecture.

4. The integrated circuit architecture of claim 1, comprising:
watchdog timer circuitry coupled to the configurable multiplexor circuitry, the watchdog timer circuitry configured to limit an amount of time that one or more of the separate secure JTAG paths may be configured in an initial unsecure state.

5. The integrated circuit architecture of claim 1, wherein the JTAG control circuitry is configured to encrypt signaling on one or more of the separate secure JTAG paths while the separate secure JTAG paths are configured in an initial unsecure state.

6. The integrated circuit architecture of claim 1, comprising:
processor circuitry coupled to the configurable multiplexor circuitry, the processor circuitry comprising a JTAG boundary scan engine coupled to the plurality of JTAG enabled integrated circuit components via the configurable multiplexor circuitry.

7. The integrated circuit architecture of claim 1, wherein the configurable multiplexor circuitry comprises a field programmable gate array (FPGA).

8. The integrated circuit architecture of claim 1, wherein the trusted boot circuitry comprises a system on a chip (SoC).

9. An apparatus, comprising:
a plurality of JTAG signal ports, each of the JTAG signal ports coupled to an isolated external JTAG signal port of one of a plurality of external JTAG enabled devices, the plurality of JTAG signal ports comprising a respective JTAG signal port for each of the isolated external JTAG signal ports; and
configurable field programmable gate array (FPGA) circuitry coupled to the plurality of JTAG signal ports via a plurality of isolated securely routed internal JTAG paths; and
JTAG control circuitry configured to decouple one or more of the securely routed internal JTAG ports from all external circuit paths while the securely routed JTAG ports are configured in an initial unsecure state.

10. The apparatus of claim 9, further comprising:
processor circuitry coupled to the FPGA circuitry; and
a plurality of input/output ports coupled to the processor circuitry.

11. The apparatus of claim 10, wherein the processor circuitry is configured to monitor signals on the plurality of isolated securely routed internal JTAG paths.

12. The apparatus of claim 10, wherein the FPGA circuitry is configured to form a JTAG scan chain of the plurality of external JTAG enabled devices.

13. The apparatus of claim 12, wherein the processor circuitry comprises a JTAG boundary scan engine configured for performing boundary scan of the JTAG scan chain.

14. The apparatus of claim 9, comprising a structural shield covering the plurality of JTAG signal ports and configured to prevent access to the plurality of JTAG signal ports, the field programmable gate array (FPGA) circuitry, the plurality of isolated securely routed internal JTAG paths, the processor circuitry coupled to the FPGA circuitry; and the plurality of input/output ports.

15. A method for securing JTAG scan chains, comprising:
separately coupling a plurality of JTAG enabled devices in the JTAG scan chains to a secure trusted boot device;
detecting JTAG security events by the trusted boot device; and
decoupling one or more JTAG paths between the JTAG enabled devices and the trusted boot device while the JTAG paths are configured in an initial unsecure state.

16. The method of claim 15, comprising:
implementing a penalty for a JTAG security event detected by the trusted boot device.

17. The method of claim 15, comprising:
latch disabling the JTAG paths between the JTAG enabled devices and the trusted boot device when the JTAG security event is detected.

18. The method of claim 17, wherein the latch disabling is maintained until a power cycle of the trusted boot device occurs.

19. The method of claim 15, comprising:
independently routing respective JTAG port I/O scan chain infrastructure signal pins of the JTAG enabled devices to the secure boot device.

* * * * *